United States Patent [19]
Liu

[11] Patent Number: 5,956,614
[45] Date of Patent: Sep. 21, 1999

[54] PROCESS FOR FORMING A METAL-SILICIDE GATE FOR DYNAMIC RANDOM ACCESS MEMORY

[75] Inventor: Jiann Liu, Irving, Tex.

[73] Assignee: Texas Instruments Incorporated, Dallas, Tex.

[21] Appl. No.: 08/989,983

[22] Filed: Dec. 12, 1997

Related U.S. Application Data

[60] Provisional application No. 60/033,655, Dec. 17, 1996.

[51] Int. Cl.[6] .................................................... H01L 21/44
[52] U.S. Cl. ........................... 438/656; 438/655; 438/592
[58] Field of Search ................................ 438/303, 305, 438/655, 656, 592, 301

[56] References Cited

U.S. PATENT DOCUMENTS 5,059,554 10/1991 Spinner et al. ........................... 138/305
5,472,896 12/1995 Chen et al. ............................... 438/305
5,874,353 2/1999 Lin et al. .................................. 438/592

*Primary Examiner*—Richard Booth
*Assistant Examiner*—John Murphy
*Attorney, Agent, or Firm*—Jacqueline J. Garner; Wade James Brady; Richard L. Donaldson

[57] ABSTRACT

A process for forming a titanium disilicide conductive layer on the upper surface of a poly gate is implemented within a self-aligned contact process. In this process, the poly layer is first formed followed by sputtering thereon of a refractory metal layer such as titanium. This is then covered by a nitride or oxide capping layer (18). A gate electrode mesa is then formed which will then have a layer of oxide (26) deposited thereon by an LPCVD technique. The temperature of this oxide deposition is such that the refractory metal layer (16) will react with the underlying poly layer (14) to form a titanium disilicide layer (28). This requires the temperature to be in excess of 600° C. for this step. Thereafter, the layer (26) will be utilized to form a sidewall spacer region.

13 Claims, 1 Drawing Sheet

PROCESS FOR FORMING A METAL-SILICIDE GATE FOR DYNAMIC RANDOM ACCESS MEMORY

This application claims priority under 35 USC § 119 (e)(1) of provisional application Ser. No. 60/033,655, filed Dec. 17, 1996.

TECHNICAL FIELD OF THE INVENTION

The present invention pertains in general to MOS transistors and, more particularly, to a process for forming the gate electrode of a transistor utilized in a DRAM.

BACKGROUND OF THE INVENTION

Dynamic random access memories (DRAMs) utilize a plurality of memory cells arranged in an array of rows and columns. Each of the memory cells is comprised of a single MOS transistor and a memory cell capacitor. The array is accessed such that selection of any given memory cell requires selection of an entire row of memory cells, with the data therein read out to the associated data line. Thereafter, column decode circuitry will determine which data lines are output from the memory.

In order to access an entire row of memory cells, a word line is provided that is disposed parallel to a given row of memory cells, which word line is raised from a low voltage to a high voltage during the Read operation. For large memory arrays, the conventional technique is to utilize a polycrystalline silicon gate electrode and arrange a transistor such that the layer that forms the gate electrodes is also the layer that forms the word line, wherein a single conductive strip can be disposed on a given row, where it overlies the gate oxide to form a gate electrode. This gate electrode is typically patterned and etched from a single layer of polycrystalline silicon (poly).

As memory arrays increase in size above the 256 Meg DRAM products, the transistors become smaller and the word lines become narrower. This has the result that the overall impedance of the word line will increase. Although the dopant level in the poly word line can be increased to vary the conductance thereof, typically the dopant level proximate to the gate oxide overlying the channel region of the transistor is controlled to achieve an optimum transistor. It is then necessary to accept the conductivity of the material that forms the transistor gate electrode as the word line. However, in order to improve the propagation delay along the word line, a lower conductivity material has been developed that is formed of a refractory metal silicide layer, such as titanium disilicide or tungsten silicide. The refractory metal silicides are formed by first depositing a thin layer of refractory metal over the polysilicon and then annealing the substrate at a temperature typically above 600° C. This results in the consumption of the polysilicon and the refractory metal to form the refractory metal silicide. This typically only consumes a portion of the upper layer, such that the lower portion of the polysilicon remains intact proximate to the gate oxide, such that the characteristics of the transistor are unchanged, while the overall conductivity of the word line is increased. However, one disadvantage to the formation of these refractory metal silicide layers is the additional process steps that are required.

SUMMARY OF THE INVENTION

A method for forming a metal silicide gate electrode is disclosed herein which includes the step of forming a gate electrode mesa over a channel region a semiconductor substrate and separated thereby with a layer of gate oxide. The gate electrode layer has a layer of polysilicon or amorphous silicon disposed proximate to the gate oxide layer, a layer of refractory metal disposed thereover and a cap layer of insulating material disposed over the refractory metal layer. A conformal layer of insulating material is then formed over the gate electrode mesa and the substrate with a process that operates at a temperature to react the refractory metal with the underlying polysilicon or amorphous silicon layer to form a refractory metal silicide layer. This refractory metal silicide layer is formed such that only a portion of the underlying polysilicon or amorphous silicon layer is consumed. Thereafter, the conformal layer is etched with a vertical etch process to remove the portion of the insulating layer on substantially horizontal surfaces to expose the surface of the semiconductor substrate on either side of the gate electrode mesa and separated therefrom by sidewall spacers formed on the sidewalls of the gate electrode mesa.

In another aspect of the present invention, the refractory metal is titanium such that a titanium disilicide layer is formed. The conformal layer of insulating material is a layer of oxide that is deposited with a low pressure chemical deposition process at a sufficient temperature to react the titanium with the underlying polysilicon or amorphous silicon layer to form titanium disilicide.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
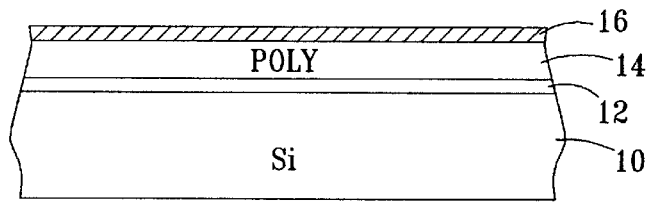
FIG. 1 illustrates a cross sectional view of the semiconductor substrate after formation of the polycrystalline gate layer and the refractory metal layer.

Referring now to FIG. 1, there is illustrated a cross sectional diagram of a substrate 10. For the formation of N-channel transistors, this substrate would be a P-type substrate. Prior to forming the structure of FIG. 1, the substrate would be subjected to processing steps that would form active regions within the substrate to provide for the formation of transistors. These active regions are typically isolated from each other with some type of isolation area such as a field oxide layer. This can be formed utilizing a locos isolation technique or a trench isolation technique. Both of these techniques are conventional. After formation of the isolation regions, the upper layers that were formed on the substrate for the purpose of forming the isolation regions are removed down to the substrate. Thereafter, a layer of gate oxide is formed on the substrate, which gate oxide layer 12 will form the gate oxide of the transistors. This gate oxide layer has a thickness between 20–100 Angstroms.

After formation of the gate oxide layer, a layer 14 of doped polysilicon or amorphous silicon is disposed on the substrate. This doped layer 14 can be doped with either N-type impurities or P-type impurities, depending upon the type of transistor to be fabricated and the properties thereof. This layer 14 is the first poly layer from which the gate electrodes of all the transistors will be formed and the word line interconnections between transistors in a given row in a DRAM. After formation of the poly layer 14 via a deposition process, this being a conformal layer, a layer of refractory metal is then deposited on the substrate over the polysilicon layer 14. In the preferred embodiment, this refractory metal is titanium. This titanium is applied via a sputtering or Chemical Vapor Deposition (CVD) technique to a thickness of approximately 200–600 Angstroms.

In a conventional process, the poly layer 14 could be patterned to form the gate electrodes, prior to sputtering the refractory metal layer thereon. In this manner, other interconnects can be formed on such regions as the exposed source and drain regions. Thereafter, the substrate would be annealed such that the refractory metal would react with the silicon to form the refractory metal silicide, such as, in the preferred embodiment, titanium disilicide (TiSi$_2$). This thin layer of titanium disilicide provides a significantly increased conductive layer. Further, only the upper portion of the gate electrode would be consumed in the silicide operation, such that the portion of the gate electrode proximate to the gate oxide would remain doped polysilicon and provide all the desired characteristics for the transistor.

In the present invention, the step following formation of the conformal layer of refractory metal 16 is to deposit low temperature nitride or oxide to form a layer 18. This layer 18 is a capping layer which is the required step for using a self-aligned contact process required in a conventional DRAM process.

Figure 3:
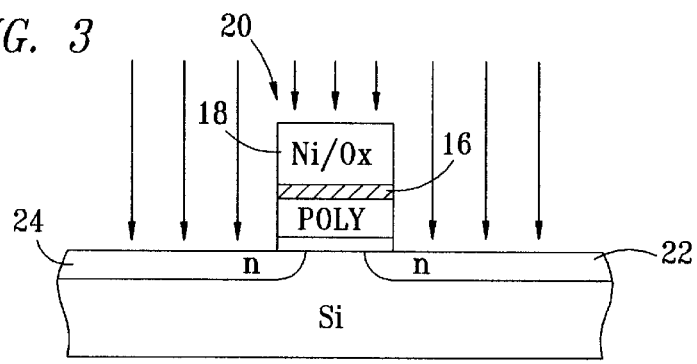
FIG. 3 illustrates a cross sectional diagram of the substrate after patterning of the gate electrode and implanting of the lightly doped drain.

In the next step of the process, as illustrated in FIG. 3, the stack structure consisting of the gate oxide 12, poly layer 14, titanium layer 16 and nitride or oxide layer 18, is patterned and etched to form a gate electrode mesa 20. Once this gate structure is formed, the exposed silicon on either side of the gate electrode 20 is subjected to an implant of N-type impurities to form Lightly Doped Drain (LDD) regions 22 and 24 on either side thereof defining the source/drain regions. This is a conventional technique. It should be noted that the titanium layer 16 remains a refractory metal layer at this point of the process, as it has not been subjected to an annealing step.

Figure 4:
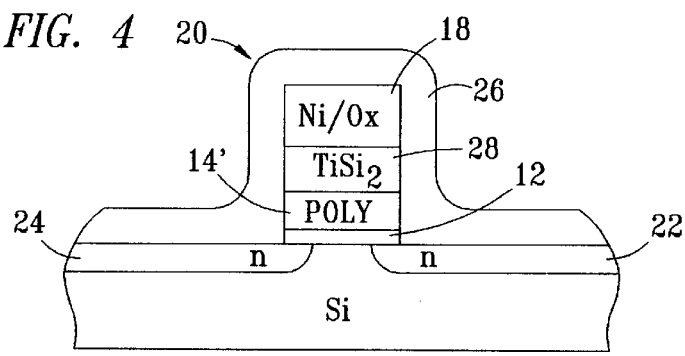
FIG. 4 illustrates a cross sectional diagram of the substrate after formation of the conformal oxide layer.

In the next step of the process, as illustrated in FIG. 4, a layer of nitride is deposited via a Low Pressure Chemical Vapor Deposition (LPCVD) process to provide a conformal layer 26 over the entire substrate. This will be utilized for the sidewall oxide formation. During the nitride deposition, the substrate is raised to a temperature in excess of 600° C. At this point, the titanium layer 16 will react with the underlying polysilicon in layer 14 to form titanium disilicide, as represented by a layer 28. This will reduce the layer 14 to a thinner layer 14'. However, it is noted that the dopant level and the constituency level of the polycrystalline silicon proximate to the gate 12 remains substantially the same. It can therefore be seen that this is a in-situ titanium disilicide formation process, whereby the steps for forming the layer 26 will also result in formation of the titanium disilicide layer 28, thus requiring one less thermal cycle for the process.

Figure 2:
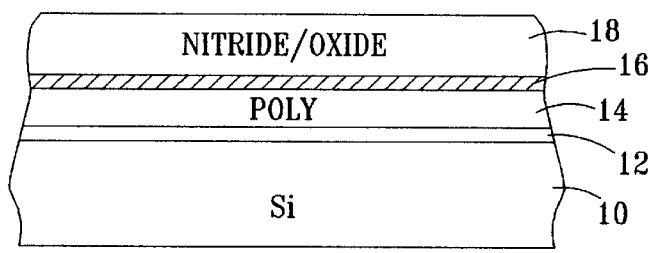
FIG. 2 illustrates the step of the process wherein the nitride capping layer has been disposed over the substrate.
Figure 5:
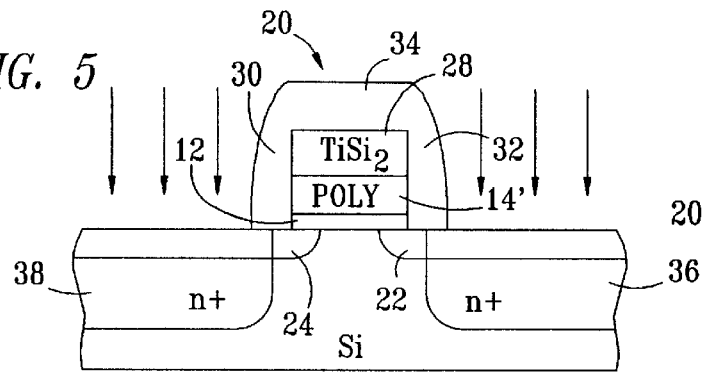
FIG. 5 illustrates a cross sectional diagram of the substrate after formation of the sidewall oxide layers and source/drain implanted regions.

In the next step of the process, as illustrated in FIG. 5, the substrate is subjected to an anisotropic or vertical etch process which will selectively etch the portions of the oxide layer 26 disposed over substantially horizontal surfaces. This will result in the formation of sidewall spacer regions 30 and 32 on either side of the gate electrode mesa with a cap region 34 disposed on top of the gate electrode titanium disilicide layer 28. The reason for this is that the nitride or oxide layer 18 that was disposed over the titanium layer 16 in the process step illustrated in FIG. 2 provided an electrically isolating layer that remained after the upper portion of the oxide layer 26 was removed. This therefore provides a self-aligned contact exposing the source/drain regions. Thereafter, the substrate is subjected to a source/drain implant, which is a high energy implant to allow introduction of N-type impurities into the region to form a source region 36 and a drain region 38 of n+material.

In summary, there has been provided a process for forming a titanium disilicide layer on the upper surface of a poly gate electrode. This process is utilized in conjunction with a self-aligned contact process, wherein a layer of refractory metal is deposited on the poly gate prior to the deposition of the capping oxide or nitride layer. The refractory metal layer, such as titanium, is reacted with the underlying poly layer to form the titanium disilicide layer during the next step of the self-aligned contact process, the step of depositing a conformal layer of oxide, which conformal layer of oxide is required to form the sidewall spacer regions. This allows one less thermal cycle in the process.

Although the preferred embodiment has been described in detail, it should be understood that various changes, substitutions and alterations can be made therein without departing from the spirit and scope of the invention as defined by the appended claims.

What is claimed is:

1. A method for forming a metal silicide gate electrode, comprising the steps of:

forming a gate electrode mesa over a channel region of a transistor region in a semiconductor substrate and separated thereby with a layer of gate oxide, the gate electrode mesa having a layer of doped polysilicon or amorphous silicon proximate to the gate oxide, a layer of refractory metal disposed adjacent the polysilicon or a amorphous silicon layer diametrically opposite the gate oxide and a cap layer of insulating material disposed over the refractory metal layer;

forming a conformal layer over the substrate and gate electrode mesa, the step of forming the conformal layer performed at a temperature that will result in the refractory metal reacting with the poly or amorphous silicon layer to form a refractory metal silicide without consuming all of the polysilicon or amorphous silicon layer; and etching the conformal layer with a vertical etch process to remove the insulating material of the conformal layer from substantially horizontal surfaces to expose the surface of the semiconductor substrate on either side of the gate electrode mesa with sidewall spacers formed on either side of the gate electrode mesa.

2. The method of claim 1, wherein the refractory metal is titanium and the refractory metal silicide is titanium disilicide.

3. The method of claim 1, wherein the step of forming the gate electrode with a cap layer of insulating material comprises forming the gate electrode with a cap layer of nitride.

4. The method of claim 1, wherein the step of forming the gate electrode with a cap layer of insulating material comprises forming the gate electrode with the cap layer of oxide.

5. The method of claim 1, wherein the step of forming a conformal layer of insulating material comprises forming a conformal layer of oxide.

6. The method of claim 5, wherein the step of forming the conformal layer of oxide comprises depositing a conformal layer of oxide with a low pressure chemical vapor deposition process.

7. The method of claim 1, wherein the etch process comprises an anisotropic etch process.

8. The method of claim 1, and further comprising implanting impurities opposite to the impurity type of the substrate into the regions of the semiconductor substrate on either side of the gate electrode mesa to form source/drain regions therein, which source/drain regions are spaced away from the gate electrode mesa with the sidewall spacers.

9. The method of claim 1, and further comprising the step of performing a lightly doped drain implant of impurities opposite in conductivity type to the impurities of the substrate in the regions of the semiconductor substrate on either side of the gate electrode mesa prior to forming the conformal layer of insulating material.

10. The method of claim 1, wherein the step of forming the gate electrode comprises:

forming a layer of gate oxide over the semiconductor substrate;

forming a conformal layer of polysilicon or amorphous silicon over the gate oxide layer;

sputtering a layer of refractory metal onto the upper surface of the polysilicon or amorphous silicon layer;

forming a layer of insulating material over the refractory metal layer; and patterning and etching the substrate to form the gate electrode mesa by etching through the insulating material layer, refractory metal layer, polysilicon or amorphous silicon layer and gate oxide layer to form the gate electrode mesa without reacting the refractory metal layer with the polysilicon or amorphous silicon layer.

11. A self-aligned contact method including the steps of forming a gate electrode mesa having a polysilicon or amorphous silicon layer with insulating cap layer disposed over a gate oxide layer in a transistor which is then followed by the formation of sidewall oxide spacers on the gate electrode mesa, and further comprising the step of forming a layer of refractory metal between the polysilicon or amorphous silicon layer and insulating cap layer, with the refractory metal reacting with the underlying polysilicon or amorphous silicon layer during the formation of the sidewall spacers to form a refractory metal silicide, with the step of forming the spacers operating with a temperature cycle that exceeds the temperature necessary for forming the refractory metal silicide.

12. The method of claim 11, wherein the refractory metal is titanium.

13. The method of claim 11, wherein the step of forming the sidewall spacers comprises the steps of:

forming a conformal layer of oxide over the substrate and gate electrode mesa with a low pressure chemical deposition process that operates at a temperature that exceeds the temperature necessary for forming the refractory metal silicide; and vertically etching the conformal layer to remove the portions of the conformal layer on a substantially horizontal surface such that sidewall spacers remain on the sidewalls on the vertical surfaces of the gate electrode mesa, with the sidewall spacers and the cap layer forming an insulating layer around the gate electrode.

* * * * *